US006835598B2

(12) United States Patent
Baek et al.

(10) Patent No.: US 6,835,598 B2
(45) Date of Patent: Dec. 28, 2004

(54) STACKED SEMICONDUCTOR MODULE AND METHOD OF MANUFACTURING THE SAME

(75) Inventors: Joong-hyun Baek, Kyungki-do (KR); Jin-yang Lee, Chungcheongnam-do (KR); Yun-hyeok Im, Kyungki-do (KR); Tae-koo Lee, Kyungki-do (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 10/376,343

(22) Filed: Mar. 3, 2003

(65) Prior Publication Data

US 2004/0018661 A1 Jan. 29, 2004

(30) Foreign Application Priority Data

Jul. 24, 2002 (KR) ................................ 10-2002-0043696

(51) Int. Cl.[7] .......................... H01L 21/24; H01L 23/02
(52) U.S. Cl. ........................................ 438/109; 257/686
(58) Field of Search ................................ 438/109, 107, 438/106; 257/777, 686

(56) References Cited

U.S. PATENT DOCUMENTS 5,675,180 A * 10/1997 Pedersen et al. ............ 257/685
5,837,566 A * 11/1998 Pedersen et al. ............ 438/109
5,843,807 A * 12/1998 Burns ......................... 438/109
5,891,761 A * 4/1999 Vindasius et al. .......... 438/109
6,168,973 B1 * 1/2001 Hubbard ..................... 438/109
6,177,296 B1 * 1/2001 Vindasius et al. .......... 438/109

FOREIGN PATENT DOCUMENTS

WO WO 03037053 A1 * 5/2003 ............ H05K/7/06

* cited by examiner

*Primary Examiner*—David Zarneke
*Assistant Examiner*—Monica D. Harrison
(74) *Attorney, Agent, or Firm*—Harness, Dickey & Pierce, P.L.C.

(57) ABSTRACT

A stacked semiconductor module includes a lower chip scale package (CSP) mounted on a module board, and an inverted upper CSP attached to the top of lower CSP to form a stacked semiconductor package. The lower and upper CSPs are electrically connected to each other outside of the stacked semiconductor package. This electrical connection may be made using the module board. Further, a conductive interconnection tape may be used to electrically connect the upper CSP to regions on the module board, which are electrically connected to the region at which the lower CSP is electrically connected to the module board.

28 Claims, 7 Drawing Sheets

400
300
600
200
100

100
110
120
120
130

STACKED SEMICONDUCTOR MODULE AND METHOD OF MANUFACTURING THE SAME

RELATED APPLICATION

This application claims the benefit of priority of Korean Patent Application No. 2002-43696, filed 24 Jul. 2002 in the Korean Intellectual Property Office (KIPO), the contents of which are herein incorporated by reference in their entirety.

1. Field of the Invention

The present invention relates to the field of semiconductor devices, and more particularly, to a semiconductor module including a stacked semiconductor package and a method of manufacturing the same.

2. Description of the Related Art

The demand for compact semiconductor devices with high memory capacities has resulted in the development of a stacked semiconductor package. In general, a stacked semiconductor package is manufactured by combining two semiconductor packages.

Such stacked semiconductor packages have been widely used in order to easily double the memory capacity of a semiconductor package. For instance, if a stacked semiconductor package is manufactured by combining two of the same semiconductor memory devices, the memory capacity of the semiconductor package is twice the capacity of each semiconductor memory device.

FIGS. 1 through 3 are cross-sectional views of conventional stacked semiconductor packages.

Referring to FIG. 1, a stacked semiconductor package 91 is a combination of two small out-line (SO) packages 10 and 20, both of which are of a lead-on-chip (LOC) type, which are connected via a metal pattern 30 fixed on a chip adhesion layer 40. The metal pattern 30 electrically connects corresponding leads of the two SO packages 10 and 20.

Referring to FIG. 2, a stacked semiconductor package 92 is a combination of two LOC type SO packages 52 and 54 that are connected via solders 58 and a small-scale printed circuit board (PCB) 56.

Referring to FIG. 3, a stacked semiconductor package 93 includes two chip scale packages (CSPs) 70 and 80 connected via a vertical-through hole 72 and solder balls 79 and 89, which are external connection terminals. Here, the stacked semiconductor package 93 encapsulants 74, a top polyimide layer 76, gold wires 78, semiconductor chips 82, a bottom polyimide layer 84, and a multi-layer type substrate 86.

Conventional stacked semiconductor packages such as those described above and shown in FIGS. 1, 2, and 3, respectively, are connected to a module board only by external connection terminals, such as leads and solder balls. In such cases, a precondition exists that both semiconductor packages are physically and electrically connected to each other within the stacked semiconductor package in order to attach the stacked semiconductor package to the module board.

SUMMARY OF THE INVENTION

In exemplary embodiments, the present invention provides a stacked semiconductor module, which includes at least one stacked semiconductor package. In each stacked semiconductor package, two semiconductor packages are electrically connected to each other by means not within the stacked semiconductor package. In exemplary embodiments, the present invention also includes a method of manufacturing such a stacked semiconductor module.

In an exemplary embodiment, the stacked semiconductor module includes a module board to which one or more stacked semiconductor packages are mounted. Each stacked semiconductor package includes a lower chip scale package (CSP) and an upper CSP, which are electrically connected with each other by means of the module board.

In another exemplary embodiment, the lower CSP may be mounted to a respective mounting region of the module board, such that the lower CSP is electrically connected to the mounting region. A conductive interconnection tape may be used to electrically connect the upper CSP to tape adhesion regions of the module board, which are electrically connected to the mounting region.

According to another exemplary embodiment, the conductive interconnection tape may comprise either a copper pattern formed on a flexible base film. In another exemplary embodiment, the conductive interconnection tape may comprise an etched lead frame.

In another exemplary embodiment, the lower CSP includes external connection terminals that are electrically connected to the respective mounting region of the module board. A chip adhesion region is formed on the lower CSP to which an inverted upper CSP is attached, such that the external connection terminals of the upper CSP is exposed in an upward direction. The external connection terminals of the upper CSP are electrically connected to a mounting region of a conductive interconnection tape. The upper CSP mounting region of the conductive interconnection tape is electrically connected to bonding regions at the ends of the conductive interconnection tape. These bonding regions are bonded and to tape adhesion regions on the module board, such that each bonding region is electrically connected to the respective tape adhesion region. The module board's tape adhesion regions are in turn electrically connected to the lower CSP mounting regions of the module board.

The lower CSP mounting region of the module board and the upper CSP mounting region of the conductive interconnection tape are configured to receive the particular type of external connection terminals utilized the lower CSP and upper CSP, respectively. For example, the upper and lower CSPs may each include either solder balls or solder bumps as their external connection terminals.

In another exemplary embodiment of the present invention, a large heat spread plate may be formed over an exposed side of a conductive interconnection tape. The heat spread plate may be attached to the conductive interconnection tape by means of a thermal interface material (TIM).

According to another exemplary embodiment, the stacked semiconductor module may include an outwardly exposed large-scale heat sink. The heat sink may be formed such that it connects a plurality of conductive interconnection tapes and stacked semiconductor packages of the stacked semiconductor module.

By providing for a CSP to be stacked upon another CSP to build a stacked semiconductor package on a module board, exemplary embodiments of the present invention facilitates the manufacture of stacked semiconductor modules. Furthermore, heat generated within such a stacked semiconductor module may be effectively discharged using a heat spread plate and/or a large-scale heat sink according to exemplary embodiments of the present invention.

BRIEF DESCRIPTION OF THE DRAWINGS

The above and other features of the present invention will become readily apparent by from the description of the exemplary embodiments that follows, with reference to the attached drawings in which.

DETAILED DESCRIPTION OF EXEMPLARY EMBODIMENTS OF THE INVENTION

Figure 1:
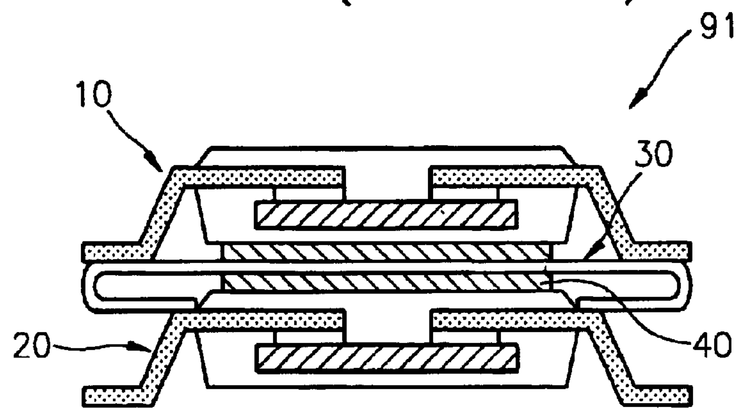
FIGS. 1 through 3 are cross-sectional views of conventional stacked semiconductor packages.
Figure 2:
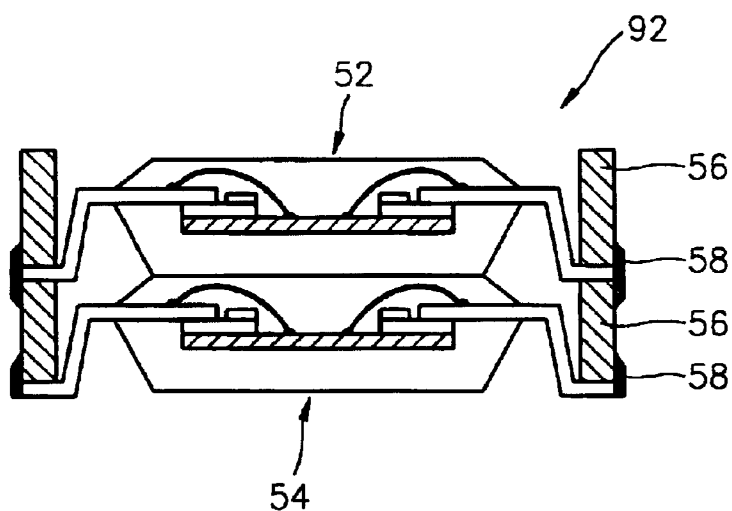
Figure 3:
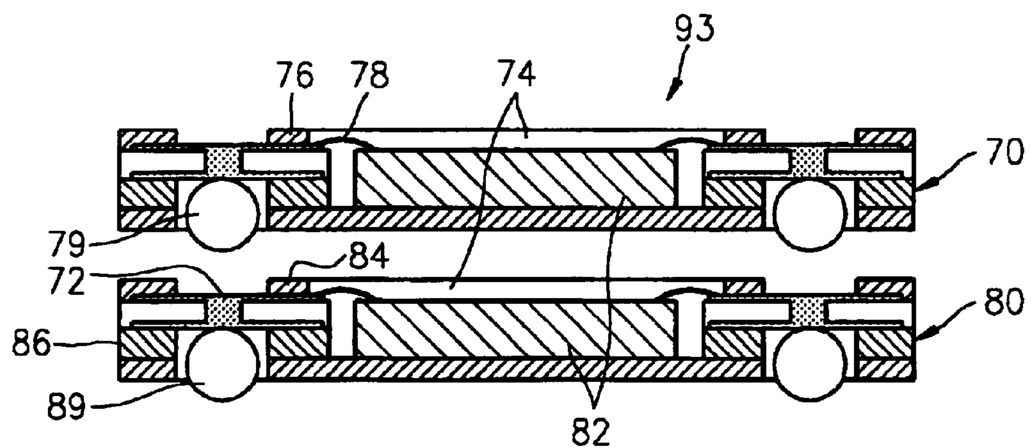

The present invention will now be described more fully with reference to the accompanying drawings, in which exemplary embodiments of the invention are shown. However, the present invention may be embodied in many different forms and should not be construed as being limited to the exemplary embodiments set forth herein. Rather, these exemplary embodiments are provided for the purpose of illustration; the present invention covers various changes in form and detail as will be readily contemplated by those ordinarily skilled in the art.

For instance, the terms conductive interconnection tape and the upper and lower chip scale packages (CSPs) are broad in meaning, and their shape and structure are not limited to the disclosed descriptions and illustrations. While the conductive interconnection tape is described as a copper pattern formed below a base film in the disclosure below, it may alternatively be made by bending an etched lead frame. Also, there is no limit to the shapes of the inside portions of the upper and lower chip scale packages (CSPs).

It should also be noted that the thicknesses of various layers and regions in the stacked semiconductor module have been exaggerated in the drawings for the purpose of clarity.

Figure 10:
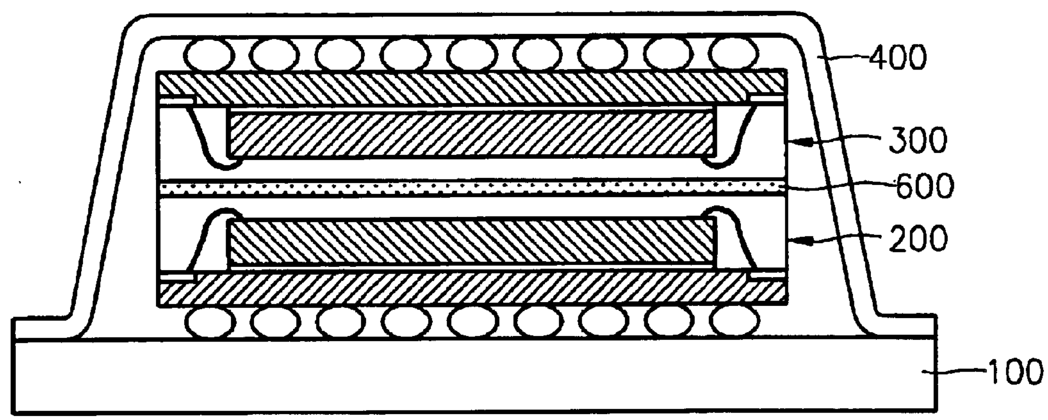
FIG. 10 is a cross-sectional view of a stacked semiconductor module according to an exemplary embodiment of the present invention.

As shown in FIG. 10, a stacked semiconductor module according to an exemplary embodiment of the present invention includes a module board 100 in the form of a printed circuit board (PCB), a lower chip scale package (CSP) 200, an upper CSP 300, a conductive interconnection tape 400, and a chip adhesion layer 600. This exemplary embodiment includes stacked structures (hereinafter referred to as stacked semiconductor packages), each of which include upper and lower CSPs 200 and 300 and at least one conductive interconnection tape 400. The external connection terminals of the lower CSP 200 is electrically connected to the module board 100. The upper CSP 300 is inverted and attached to the chip adhesion layer 600 on the lower CSP 200, so that the external connection terminals of the upper CSP 300 are facing upward, away from the lower CSP 200. The chip adhesion layer 600 may be formed of any material, e.g., solder, liquid epoxy, and an adhesive tape, capable of securing semiconductor packages together. The external connection terminals of the upper CSP 300 are connected to the conductive interconnection tape 400, which is electrically connected to the module board 100.

The overall structure of the stacked semiconductor module and the stacked semiconductor packages according to this exemplary embodiment will be explained below with reference to FIGS. 4 through 10.

Figure 4:
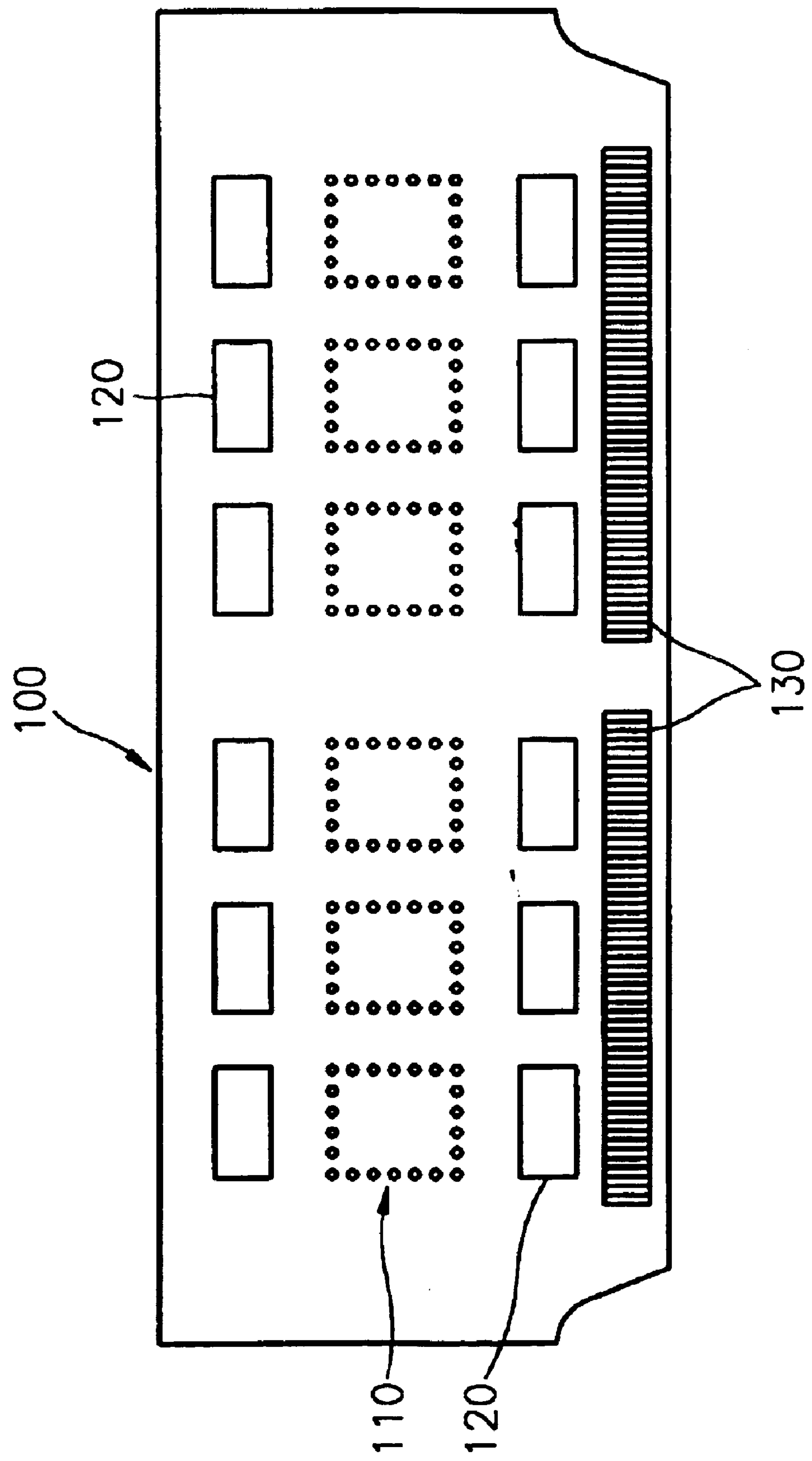
FIG. 4 is a plan view of a module board of a stacked semiconductor module according to an exemplary embodiment of the present invention.

FIG. 4 is a plan view of a module board 100 of the stacked semiconductor module according to an exemplary embodiment of the present invention. The module board 100 includes a plurality of mounting regions 110 to which respective lower CSPs 200 are attached (hereinafter, referred to as lower CSP mounting regions), a plurality of tape adhesion regions 120, which are electrically connected to the lower CSP mounting regions 110 and to which an interconnection tape 400 of a copper pattern is adhered, and module pin connection regions 130. The lower CSP 200 is connected to each lower CSP mounting region 110 of the module board 100 via external connection terminals. Upper and lower portions of a conductive interconnection tape 400 are connected to the external connection terminals of the upper CSP 300 and the tape adhesion portions 120 of the module board 100, respectively.

Referring to FIG. 4, the module board 100 is a PCB in which a copper pattern is formed on a plastic board of, e.g., an FR4 material. The module board 100 includes the lower CSP mounting regions 110; the tape adhesion regions 120, which are electrically connected to the lower CSP mounting region 110; and the module pin connection regions 130 that outwardly extend the copper patterns connecting the lower CSP mounting regions 110 and the tape adhesion regions 120. One or more of the tape adhesion regions 120 are electrically connected to each lower CSP mounting region 110, and a conductive interconnection tape 400 (described in more detail below with respect to FIG. 9) is attached to each tape adhesion region 120.

The lower CSP mounting regions 110 are places to which externally-projected connecting terminals, such as solder bumps or solder balls, of the lower CSPs 200 are attached. Thus, each lower CSP mounting region 110 is configured to receive the external connection terminals of the corresponding lower CSP 200, i.e., the shape of the lower CSP mounting region 110 corresponds to the shape of the external connection terminals of the lower CSP 200. In FIG. 4, one lower CSP mounting region 110 is illustrated as corresponding to two tape adhesion regions 120. However, the number of the tape adhesion regions 120 corresponding to one lower CSP mounting region 110 may be within a range from one to four. The module pin connection regions 130 are terminals through which a semiconductor module according to this exemplary embodiment of the present invention may be operatively connected to other printed circuit boards.

Figure 5:
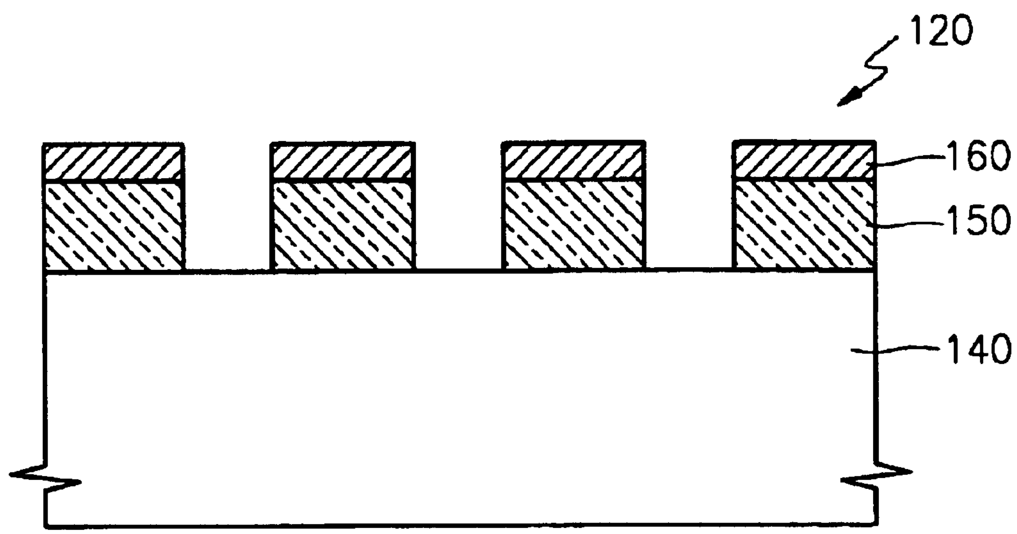
FIGS. 5 and 6 are cross-sectional views of a surface of a tape adhesion region on a module board according to an exemplary embodiment of the present invention.
Figure 6:
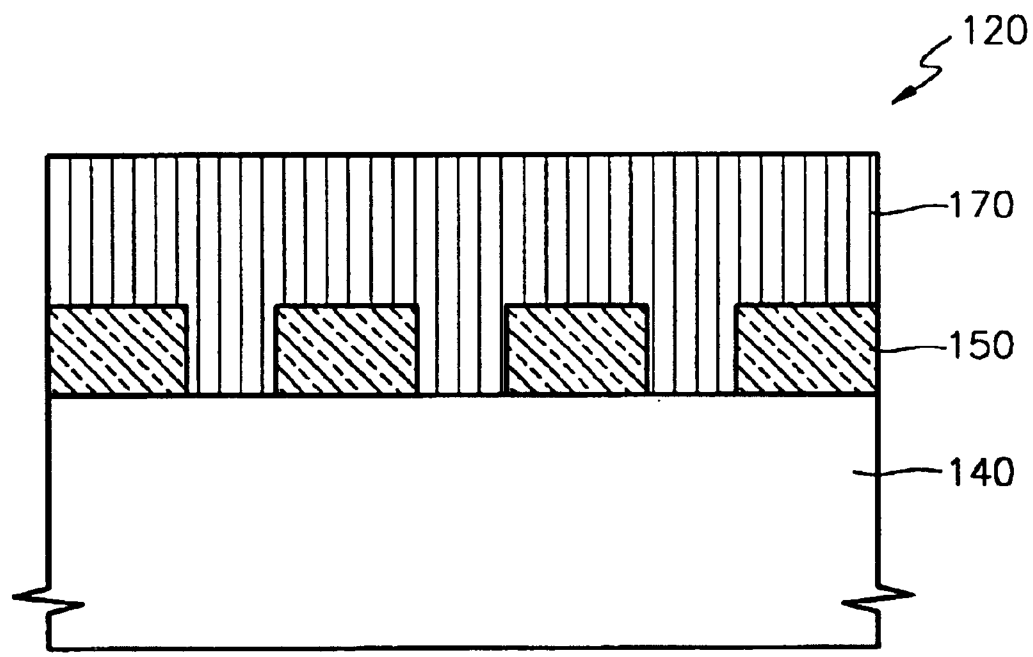

FIGS. 5 and 6 are cross-sectional views of a surface of one of the tape adhesion regions 120 illustrated in FIG. 4 according to other exemplary embodiments of the present invention. Referring to FIGS. 5 and 6, the surface of the tape adhesion region 120 of the module board 100 is processed in order to facilitate bonding of the tape adhesion region 120 with the conductive interconnection tape 400 during a subsequent process. FIGS. 5 and 6 show that the surface of the tape adhesion region includes a copper pattern 150 formed on a plastic substrate 140. In the embodiment of FIG. 5, a photo solder resist (PSR) 160 is applied onto the copper pattern 150. In the exemplary embodiment of FIG. 6, an anisotropic conductive adhesive 170 is deposited to entirely cover the copper pattern 150 and the exposed portions of the plastic substrate 140.

The anisotropic conductive adhesive 170 of FIG. 6 may include a conductive material that has a conductivity running up and down due to an adhesive material contained in the anisotropic conductive adhesive 170. The anisotropic conductive adhesive 170 is more effective when used on a copper pattern 150 having fine pitches.

Figure 7:
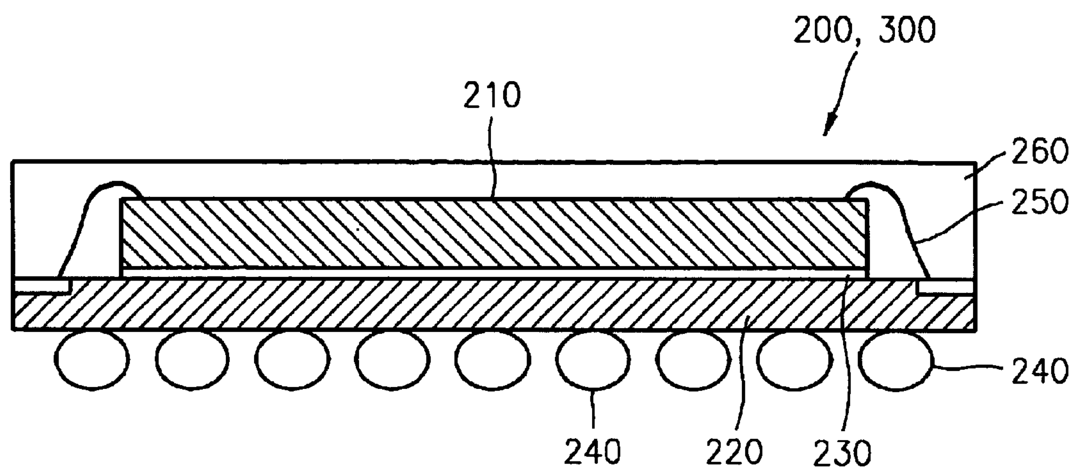
FIG. 7 is a cross-sectional view of a chip scale package (CSP) implemented in a stacked semiconductor module according to an exemplary embodiment of the present invention.
Figure 8:
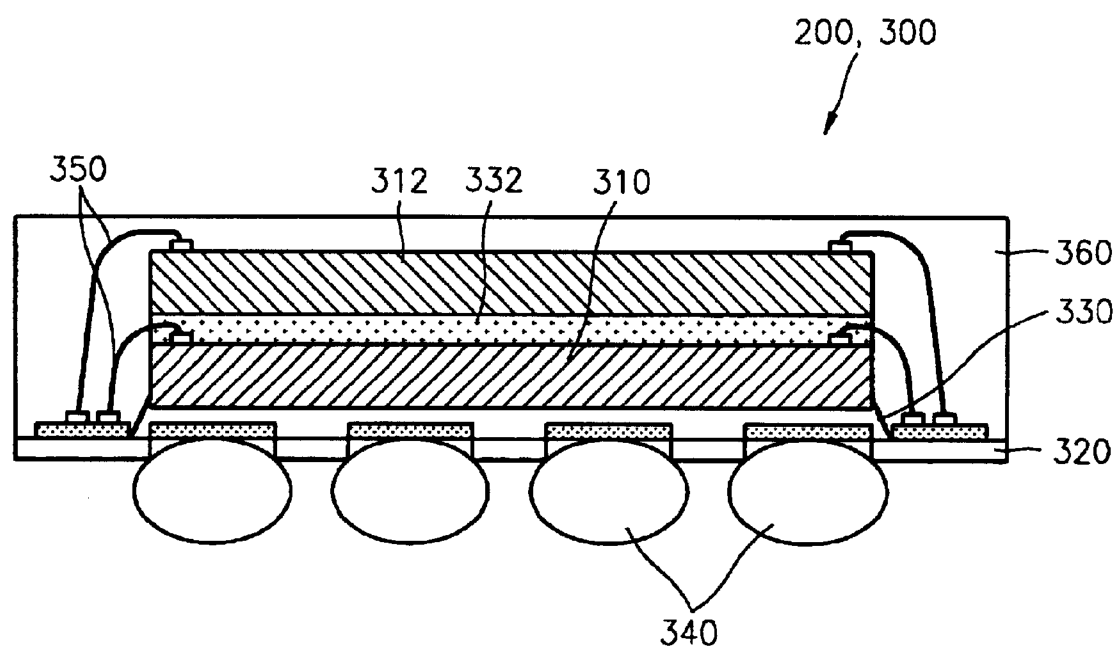
FIG. 8 is a cross-sectional view of a chip scale package (CSP) of a stacked semiconductor module according to another exemplary embodiment of the present invention.

FIGS. 7 and 8 are cross-sectional views of a CSP implemented in a stacked semiconductor module according to other exemplary embodiments of the present invention.

In detail, FIG. 7 is a cross-sectional view of a fine pitch ball grid array (FBGA) semiconductor package that can be used as the lower CSP 200 and/or upper CSP 300. The FBGA may be manufactured by adhering a semiconductor chip 210 to a substrate 220 by means of an epoxy or adhesive tape 230, performing wire bonding on the resultant structure using gold wires 250, molding the resultant structure with a sealing resin 260, and attaching solder balls 240 to the bottom of the substrate 220.

FIG. 8 is a cross-sectional view of a double die package (DDP) including two semiconductor chips 310 and 312, which can be used as the lower CSP 200 and/or 300 in another exemplary embodiment. The DDP may be manufactured according to the following exemplary process.

First, the lower semiconductor chip 310 is attached to a substrate 320 using a die adhesive 330. A first wire bonding is performed on the resultant structure using gold wires 350 and an adhesive 332 is applied onto the lower semiconductor chip 310. The two semiconductor chips 310 and 312 are then attached to each other by placing the upper semiconductor chip 312 on the adhesive 332. Next, a second wire bonding is performed on the resultant structure by attaching the gold wires 350 to the upper semiconductor chip 312. The resultant structure is molded using a sealing resin 360, and solder balls 340 are attached to the bottom of the substrate 320 as external connection terminals.

FIGS. 7 and 8 are illustrative of exemplary types of semiconductor packages that can be used as the upper and lower CSPs 200, 300 in the present invention. Alternatively, the upper and/or lower CSPs 200, 300 may include any of the following types of semiconductor packages: tape ball grid arrays (TBGAs), wire bonding ball grid arrays (WBGAs), stacked structures of three or more semiconductor chips, and other types that will be contemplated by those of ordinary skill in the art. When the external connection terminals of the upper and lower CSPs 200 and 300 are either solder balls or solder bumps rather than leads, the exemplary embodiments of the present invention do not limit the inner structure of the upper and lower CSPs 200 and 300 to any particular type, as will be readily apparent to those ordinarily skilled in the art.

Figure 9:
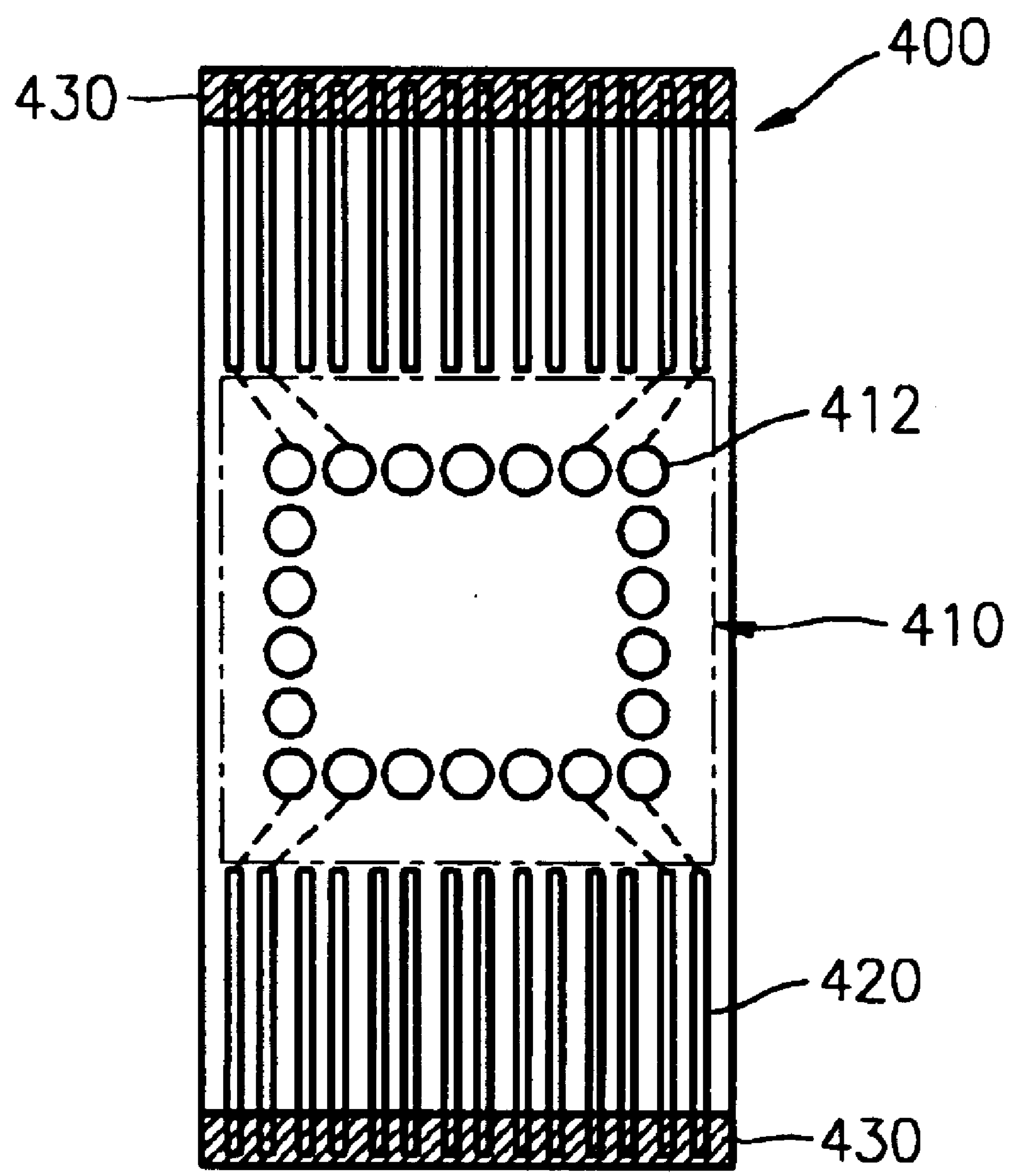
FIG. 9 is a view of the bottom side of a conductive interconnection tape in a stacked semiconductor module according to an exemplary embodiment of the present invention.

FIG. 9 is a view of the bottom side of a conductive interconnection tape 400 employed in a stacked semiconductor module according to an exemplary embodiment of the present invention. Referring to FIG. 9, the conductive interconnection tape 400 may be a structure in which a copper pattern is formed on a flexible base film, such as polyimide. In this exemplary embodiment, the copper pattern of the conductive interconnection tape 400 includes an upper CSP mounting region 410, a connection pattern 420, and one or more tape bonding regions 430.

The upper CSP mounting region 410 is electrically connected to the upper CSP 300, which may be of the type shown in either FIG. 7 or FIG. 8. Thus, the upper CSP mounting region 410 is configured to receive the external connection terminals of the upper CSP 400. In other words, the shape of the copper pattern regions 412 in the upper CSP mounting region 410, to which the external connection terminals are adhered, substantially corresponds to the shape of the external connection terminals of the upper CSP 300.

According to this exemplary embodiment, the connection pattern 420 is a one-layered or multi-layered copper pattern, which is electrically connected to the upper CSP mounting region 410 and extends into the tape bonding regions 430. The conductive interconnection tape 400 preferably includes at least one tape bonding region 430 at both ends. Each tape bonding region 430 is bonded with a corresponding tape adhesion region 120 of the module board 100. In an exemplary embodiment, heat and pressure are applied to bond the tape bonding region 430 of the conductive interconnection tape 400 with the tape adhesion region 120 of the module board 100. In another exemplary embodiment, the tape bonding region 430 is united with the tape adhesion region 120 of module board using another type of bonding technique, such as the technique used in a tape automated bonding (TAB) package mounting process.

In the exemplary embodiment described above, the conductive interconnection tape 400 includes a copper pattern formed on the underside of a polyimide base film. However, the conductive interconnection tape 400 is not limited to such an embodiment. Other structures and materials may be implemented for the conductive interconnection tape 400, as will be contemplated by those of ordinary skill in the art. For instance, the interconnection tape 400 may be made by bending an etched lead frame.

Although the conductive interconnection tape 400 has been described above as including at least one tape bonding region 430 at each end, it should be noted that exemplary embodiments of the present invention are not thus limited. The conductive interconnection tape 400 may include only one tape bonding region 430, and thus be connected to only one tape adhesion region 120 on the module board 100. In another exemplary embodiment, multiple conductive interconnection tapes 400 may be used to connect a single stacked semiconductor package to the module board 100. For example, more than one conductive interconnection tape 400 may be connected to an upper CSP 300 of the stacked semiconductor package. In such an exemplary embodiment, the tape bonding regions 430 of these conductive interconnection tapes 400 may be connected to multiple tape adhesion regions 120 of the module board 100 corresponding to a lower CSP mounting region 110 on which the lower CSP 200 of the stacked semiconductor package is mounted.

FIG. 10 is a cross-sectional view of a stacked semiconductor module according to an exemplary embodiment of the present invention. Referring to FIG. 10, a stacked semiconductor module according to an exemplary embodiment of the present invention includes a module board 100, a lower CSP 200, a chip adhesion region 600, an upper CSP 300, and a conductive interconnection tape 400. The conductive interconnection tape 400 and the copper pattern on the module board 100 electrically connects the lower and upper CSPs 200 and 300. Conventionally, a semiconductor package is bonded with a module board only using external connection terminals of the semiconductor package. However, exemplary embodiments of the present invention further include the conductive interconnection tape 400 to make this connection. Thus, when attaching a stacked semiconductor package to a module board according to exemplary embodiments of the present invention, an electrical connection between the upper semiconductor package (i.e., upper CSP 300) and the lower semiconductor package (i.e., lower CSP 200) does not need to be made within the stacked semiconductor package. The electrical connection between the upper CSP 300 and the lower CSP 200 can be fabricated using the conductive interconnection tape 400.

Figure 11:
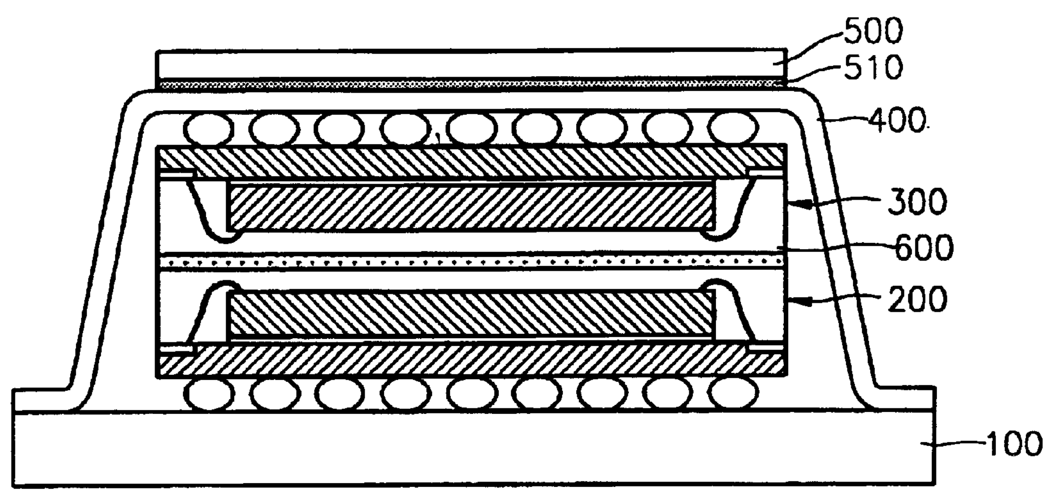
FIG. 11 is a cross-sectional view of a stacked semiconductor module having a heat spread plate, according to an exemplary embodiment of the present invention.

FIG. 11 is a cross-sectional view of a stacked semiconductor module having a heat spread plate, according to an exemplary embodiment of the present invention. Referring to FIG. 11, a heat spread plate 500 is attached to a stacked semiconductor module (e.g., the stacked semiconductor module shown in FIG. 10) using a thermal interface material (TIM) 510. According to an exemplary embodiment, the TIM 510 may be form on the top side of one or more conductive interconnection tapes 400 in the stacked semiconductor module, and the heat spread plate 500 may be formed on top of the TIM 510. Thus, the heat spread plate may be attached to the conductive interconnection tape 400 via the TIM 510. The heat spread plate 500 may be formed of metal, such as nickel, iron, and aluminum, using chemical vapor deposition (CVD). Otherwise, the heat spread plate 500 may be a layer formed of a composite including one or more of the above metals or formed of an alloy containing one or more of the above metals. The TIM 510 may be formed of any material having excellent heat conductivity and adhesive strength, as will be readily apparent to those of ordinary skill in the art.

Figure 12:
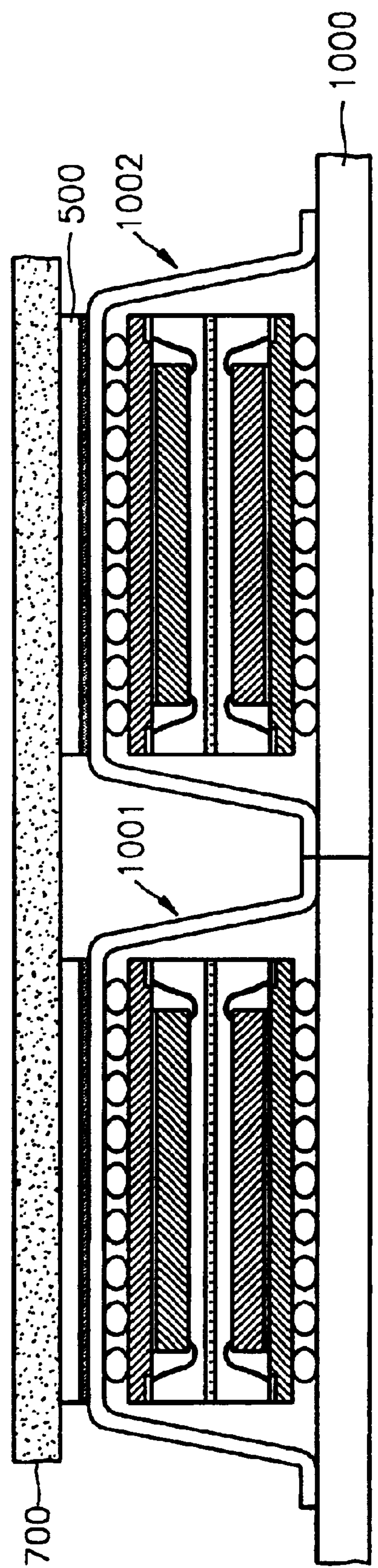
FIG. 12 is a cross-sectional view of a stacked semiconductor module having a large-scale heat sink, according to an exemplary embodiment of the present invention.

FIG. 12 is a cross-sectional view of a stacked semiconductor module having a large-scale heat sink 700 according to an exemplary embodiment of the present invention. Referring to FIG. 12, the large-scale heat sink 700 may be attached to the heat spread plate 500 using an adhesive tape or a TIM. Alternatively, the large-scale heat sink can be attached to a conductive interconnection tape 400 using either an adhesive tape or TIM. The large-scale heat sink 700 may be attached to the stacked semiconductor module to be outwardly exposed.

According to an exemplary embodiment, the large-scale heat sink 700 can be formed over multiple stacked semiconductor packages, rather than only one stacked semiconductor package. For example, FIG. 12 shows the large-scale heat sink 700 formed over and uniting stacked semiconductor packages 1001 and 1002 together on a module board 1000. In this exemplary embodiment, the large-scale heat sink 700 may be formed over a plurality of conductive interconnection tapes 400, thereby connecting the conductive interconnection tapes 400 and their corresponding stacked semiconductor modules 1001, 1002.

A stacked semiconductor module having the heat spread plate 500 and/or the large-scale heat sink 700, according to exemplary embodiments of the present invention, outwardly discharges heat generated in the stacked semiconductor packages 1001 and 1002 both in a downward direction via the module board 1000 and in an upward direction via the heat spread plate 500 and/or the large-scale heat sink 700.

Hereinafter, a method of manufacturing a stacked semiconductor module according to an exemplary embodiment of the present invention will be described with reference to FIGS. 10 through 12. First, the module board 100, which may be a printed circuit board (PCB), is prepared to include one or more lower CSP mounting regions 110, one or more tape adhesion regions 120 that are electrically connected to each lower CSP mounting regions, and module pin connection regions 130. A lower CSP 200 is bonded with a corresponding lower CSP mounting region 110 of the module board 100 using surface mounting technology (SMT), such that the protruding external connection terminals of the lower CSP is electrically connected to the corresponding lower CSP mounting region 110. An adhesive chip adhesion region 600 is formed on the lower CSP 200. An upper CSP 300 is inverted while being attached to the formed chip adhesion region 600, so that the protruding external connection terminals of the upper CSP 300 are turned upward, away from the lower CSP 200.

An upper CSP mounting region 410 of the conductive interconnection tape 400 is bonded with the external connection terminals of the upper CSP 300, and one or more tape bonding regions 430 of the conductive interconnection tape 400 is bonded (and electrically connected) to respective tape adhesion regions 120 of the module board. In an exemplary embodiment, a TIM 510 may be formed on the conductive interconnection tape 400, and a heat spread plate 500 is formed on the TIM 510. Furthermore, a TIM 510 or an adhesive tape may be formed on the heat spread plate 500, and a large-scale heat sink 700 may be formed over the heat spread plate, the large-scale heat sink 700 being attached to the TIM 510 or the adhesive tape. According to another exemplary embodiment, the large-scale heat sink 700 may be formed over the conductive interconnection tape 400 without first forming the heat spread plate 500. The large-scale heat sink may thus be attached to the conductive interconnection tape 400 by means of a TIM 510 or an adhesive tape.

As mentioned above, exemplary embodiments of the present invention make it possible to manufacture a stacked semiconductor module by electrically connecting the semiconductor packages of a stacked semiconductor package using a copper pattern on a module board, rather than requiring the electrical connection to be made within the stacked semiconductor package. The stacked semiconductor module of exemplary embodiments of the present invention also allows for heat generated in a stacked semiconductor package to be outwardly discharged in both an upward and downward direction. In addition, exemplary embodiments of the present invention allow for a stacked semiconductor package to be manufactured from various types of chip scale packages (CSPs) having external connection terminals, such as solder balls and solder bumps, such that the CSPs need not be electrically connected with each other in the stacked semiconductor package, but rather may be electrically connected by means of a module.

While this invention has been particularly shown and described with reference to the exemplary embodiments described above, it will be understood by those skilled in the art that these exemplary embodiments do not limit the present invention, and that various changes in form and details may be made without departing from the spirit and scope of the invention as defined by the appended claims.

What is claimed is:

1. A stacked semiconductor module, comprising:

a module board; and at least one stacked semiconductor package, each stacked semiconductor package including two or more chip scale packages (CSPs) electrically connected to each other outside the stacked semiconductor package.

2. The stacked semiconductor module of claim 1, wherein the at least two CSPs include a double die package (DDP).

3. The stacked semiconductor module of claim 1, wherein the at least two CSPs include at least one of a fine pitch ball grid array (FBGA) package, a tape ball grid array (TBGA) package, and a wire bonding ball grid array (WBGA) package.

4. The stacked semiconductor module of claim 1, wherein the at least two CSPs includes a CSP, which is a stacked structure of two or more semiconductor chips.

5. The stacked semiconductor module of claim 1, wherein the two or more CSPs are electrically connected via the module board.

6. The stacked semiconductor module of claim 5, wherein the two or more CSPs include a lower CSP and a higher CSP, the lower CSP being electrically connected to the module board, and the stacked semiconductor module further includes, at least one conductive interconnection tape electrically connecting the upper CSP to the module board.

7. The stacked semiconductor module of claim 6, wherein the conductive interconnection tape comprises an etched lead frame.

8. The stacked semiconductor module of claim 6, wherein the conductive interconnection tape includes a copper pattern formed on a flexible base film, the flexible base film including a polyimide.

9. The stacked semiconductor module of claim 6, wherein the module board is a printed circuit board (PCB) including, a mounting region at which the lower CSP is electrically connected;

at least one tape adhesion region at which the at least one conductive interconnection tape is electrically connected;

a copper pattern electrically connecting the mounting region and the at least one tape adhesion region; and a module pin connection region at which the copper pattern outwardly extends.

10. The stacked semiconductor module of claim 9, wherein the module board includes no more than four tape adhesion regions corresponding to the mounting region.

11. The stacked semiconductor module of claim 6, wherein the lower CSP and the upper CSP each include, a substrate having a first and second side;

at least one semiconductor chip formed over the first side of the substrate, the at least one semiconductor chip being electrically connected to the substrate, and one or more external connection terminals attached to the second side of the substrate.

12. The stacked semiconductor module of claim 11, wherein the upper CSP is inverted and attached to the lower CSP via at least one chip adhesion region, the external connection terminals of the lower CSP being electrically connected to a lower CSP mounting region of the module board, the external connection terminals of the upper CSP being electrically connected to the conductive interconnection tape.

13. The stacked semiconductor module of claim 12, wherein the at least one chip adhesion region comprises at least one of an adhesive tape, a solder, and a liquid adhesive hardened by heat.

14. The stacked semiconductor module of claim 12, wherein the conductive interconnection tape includes a copper pattern formed on a flexible base film, the copper pattern including, an upper CSP mounting region to which the external connection terminals of the upper CSP are electrically connected;

one or more tape bonding regions at each end of the copper pattern, each tape bonding region being electrically connected to a tape adhesion region of the module board; and a connection pattern electrically connecting the upper CSP mounting region to the tape bonding regions.

15. The stacked semiconductor module according to claim 14, wherein the module board includes a substrate, the tape bonding region being electrically connected to the lower CSP mounting region by a conductive pattern formed over the substrate; and the tape bound region includes at least one of a photo solder resist (PSR) and an anisotropic conductive adhesive formed over at least a portion of the conductive pattern and the substrate.

16. The stacked semiconductor module according to claim 15, wherein the external connection terminals of the lower CSP are of a first type and the external connection terminals of the upper CSP are of a second type, the first and second type each being one of solder bump and solder ball, and the lower CSP mounting region and the upper CSP mounting region are configured to receive the external connection terminals of the first and second type, respectively.

17. The stacked semiconductor module of claim 6, further comprising a heat spread plate formed over the at least one stacked semiconductor package.

18. The stacked semiconductor module of claim 17, wherein the heat spread plate includes a metal layer formed over a thermal interface material (TIM) on the at least one conductive interconnection tape.

19. The stacked semiconductor module of claim 18, wherein the metal layer comprises at least one of nickel, iron, aluminum.

20. The stacked semiconductor module of claim 6, further comprising a heat sink formed over the at least one conductive interconnection tape, the heat sink being outwardly exposed.

21. The stacked semiconductor module of claim 20, the at least one semiconductor package including a plurality of semiconductor packages, wherein the heat sink is formed over the conductive interconnection tapes electrically connecting the upper CSPs of the plurality of semiconductor packages to the module board, the heat sink connecting the conductive interconnection tapes.

22. A method of manufacturing a stacked semiconductor module comprising:

a) preparing a module board to include one or more mounting regions;

b) mounting a stacked semiconductor package on each mounting region, the stacked semiconductor package including a lower chip scale package (CSP) and an upper CSP; and c) electrically connecting the lower CSP to the upper CSP outside the stacked semiconductor package.

23. The method of claim 22, wherein the step c) electrically connects the lower CSP to the upper CSP via the module board.

24. The method of claim 23, the lower CSP being electrically connected to a corresponding one of the mounting regions, wherein the step c) uses a conductive interconnection tape to electrically connect the upper CSP to one or more tape adhesion regions on the module board, the tape adhesion regions being electrically connected to the corresponding mounting region.

25. The method of claim 24, each of the lower and upper CSPs including a substrate, the substrate including a first and second side, the first side including a semiconductor chip and the second side including external connection terminals, wherein the step b) includes, b1) electrically connecting the external connection terminals of the lower CSP to the corresponding mounting region;

b2) forming at least one chip adhesion region over the lower CSP;

b3) inverting the upper CSP and attaching the inverted upper CSP to the at least one chip adhesion region such that the external connection terminals are facing away from the lower CSP, and the step c) bonds the external connection terminals of the upper CSP to the conductive interconnection tape in order to electrically connect the upper CSP to the tape bonding regions.

26. The method of claim 24, the method further comprising forming a heat spread plate over the conductive interconnection tape.

27. The method of claim 24, the method further comprising:

repeating the steps b) and c) to mount and electrically connect a plurality of stacked semiconductor packages to the module board using a plurality of conductive interconnection tapes;

forming an outwardly exposed heat sink over the conductive interconnection tapes, the heat sink connecting the plurality of conductive interconnection tapes.

28. A stacked semiconductor module manufactured in accordance with the method of claim 22.

* * * * *